(12) United States Patent
Misaka

(10) Patent No.: US 6,467,626 B1
(45) Date of Patent: Oct. 22, 2002

(54) WAFER STORING METHOD AND STORING CONTAINER THEREFOR AND WAFER TRANSFERRING METHOD FOR TRANSFERRING WAFER TO THE STORING CONTAINER

(75) Inventor: Hitoshi Misaka, Fukushima (JP)

(73) Assignee: Shin-Etsu Handotai Co, Ltd., Tokyo (JP)

( * ) Notice: Subject to any disclaimer, the term of this patent is extended or adjusted under 35 U.S.C. 154(b) by 0 days.

(21) Appl. No.: 09/806,235

(22) PCT Filed: Jun. 30, 2000

(86) PCT No.: PCT/JP00/04366
§ 371 (c)(1),
(2), (4) Date: Jun. 28, 2001

(87) PCT Pub. No.: WO01/08210
PCT Pub. Date: Feb. 1, 2001

(30) Foreign Application Priority Data

Jul. 28, 1999 (JP) .............................................. 11-213498

(51) Int. Cl.$^7$ .......................... B65D 85/00; H01L 21/31
(52) U.S. Cl. .................... 206/710; 206/213.1; 206/583; 438/758; 438/800; 414/217
(58) Field of Search ................. 438/758, 800; 206/213.1, 445, 454, 583, 710, 711, 712; 414/217

(56) References Cited

U.S. PATENT DOCUMENTS

| | | | | |
|---|---|---|---|---|
| 4,129,211 A | * | 12/1978 | Clement et al. | ......... 206/213.1 |
| 4,171,740 A | * | 10/1979 | Clement et al. | ......... 206/213.1 |
| 5,105,628 A | * | 4/1992 | Nakai et al. | .................... 62/78 |
| 5,725,100 A | * | 3/1998 | Yamada et al. | ............. 206/710 |

* cited by examiner

Primary Examiner—Alexander Ghyka
(74) Attorney, Agent, or Firm—Crowell & Moring LLP

(57) ABSTRACT

Adhesion of particles on the surface of a wafer is prevented even if particles are generated during transport, by transferring the wafers after mirror-polishing, cleaning, and drying into a container body having an opening which is closed and hermetically sealed with a cover after introduction of the wafers. The container body is disposed so that the opening is oriented in a direction other than an upward direction, and with the container body in this attitude dry air is supplied through the opening to replace the air in the container body with dry air. Then the container is oriented with the opening facing a wafer supply position and wafers are transferred into the container while the dry air is maintained in the container, after which the top cover is attached to the container body, with all of these steps being performed under highly clean air having an absolute water content of 2 ppm or less.

11 Claims, 5 Drawing Sheets

WAFER STORING METHOD AND STORING CONTAINER THEREFOR AND WAFER TRANSFERRING METHOD FOR TRANSFERRING WAFER TO THE STORING CONTAINER

FIELD OF THE INVENTION

The present invention relates to a method of housing wafers mirror-polished, cleaned, dried of their surfaces and a container for housing the wafers, and a transfer process for housing the wafers into the container. Specifically, it relates to a method for housing wafers, a container for housing the wafers, and a transfer process for housing the wafers into the container, for the sake of decreasing the adhesion of particles generated in the process of transport and so forth on the surfaces of the mirror-polished silicon wafers.

TECHNICAL BACKGROUND

The manufacturing process of semiconductor devices, for example, memory chips and LSI chips, is largely divided into following process steps: the single crystal producing step in which a single crystal silicon ingot is obtained from polycrystalline silicon; the wafer processing step in which the ingot is sliced and the thin plate-like wafers are mirror-polished; and the device manufacturing step in which various devices are fabricated on the mirror polished wafers. The each process step has various batch treatment divisions. Each of the treatments and steps is processed in batches or in other places, and with time intervals. Therefore, there is a case where the wafers are housed in containers to be stored or transported between the treatment divisions or steps.

Particularly, in almost all cases, process steps until mirror polishing step and the device manufacturing step in which various ICs are produced on the mirror polished wafers, are performed in different companies. In that case, the wafers processed until mirror polishing are housed in a container in a large number and shipped to a device manufacturing company. The container is often called shipping box.

As non-existence is required of particles, organic substances and ions on the surface of wafer in the device manufacturing step, cleaning for removal of the particles is performed at the last of the wafer processing step, that is, before housing the wafers into the container for shipment.

The influence of the shipping box was also examined. The result was that the chlorine and organic substances coming out from the box becomes problem, and improvements in the material, etc. of the box have been done. There is also disclosed a method in which the atmosphere in the box is substituted by nitrogen gas for the sake of preventing the generation of so-called "Kasumi" (cludiness) on the wafer (for example, Japanese Unexamined Patent Publication No. Hei 10-92918).

As described above, when wafers are shipped to a device manufacturing company, extreme cautions must be paid as to the protection of the surfaces of the wafers from contamination. But there has been no effective method for preventing the adhesion of particles to the surfaces of the wafers.

For example, an art is disclosed in Japanese Unexamined Patent Publication No. Hei 8-64666, in which wafers are housed in a gas-tight container filled with high purity steam obtained from a pure water bubbling section prepared at some midpoint in the supply route of dry gas, for the sake of removing the influence of particle and gas contamination.

The art is effective in the case where hydrofluoric acid treatment, which is referred to as hydrofluoric anhydride treatment in the Japanese Unexamined Patent Publication No. Hei 8-64666, is prepared at the next step. Also, the art is effective in reducing the quantity of high purity nitrogen gas for purging to increase atmosphere purity in the container.

However, according to the test result by the inventor of the present invention, it was proved that the art is not much useful in the prevention of adhesion of the particles generated from the container, and that it is not suitable as a housing method and transfer method for housing in the case the mirror-polished wafers are transported to a device manufacturing process.

When a number on thin plate-like wafers are housed and supported in a container for storage or transport, the container(shipping box) is subjected to various vibrations during transport. Scrubbing between the contacting parts of the box and falling off of the dust depositing on the inner surface of the box caused by the friction due to the vibrations, allow particles to be generated: these particles adhere to the wafers by the action of vibration and static electricity. Here particle is a collective name of fine grains of substance floating in space or adhering to the surface of a thing, and is composed of metals, inorganic substances, and organic substances.

The generation of particles in a container during transport has not been so problematic while the degree of integration of LSI is low and required design rules in LSI manufacturing process is not so minute. But the degree of integration has become higher, and for manufacturing LSI of 1 G level, particle size to be controlled has become small, making the increase of particles during transport not negligible problem. Finer design rules of sub-micron with increasing degree of integration has lowered the size of particle to be controlled from $0.16 \mu m$ to $0.10 \mu m$. In the future generation of $0.13 \mu m$ design rules, the particle size to be controlled will be $0.08 \mu m$.

Adherence of particles to the wafer in the device process causes not only a short or damage in the fine circuit, but the particle of metal and organic substance cause the degradation of device characteristics, inducing to low yields.

Therefore, these particles is listed in the inspection items, and the wafer transferred from the wafer processing step is inspected in the device process, in which acception or rejection check is done based on the size and number of particles.

Although the wafer is cleaned in the wafer processing step to remove the particles, many of device makers clean the wafer at receiving step of device process. Higher level of cleaning is necessary to clean the particles down to those of smaller size, and man-hour increases.

It is difficult to completely prevent the adhesion of particles generated during transport on wafers. Particularly, when the wafers are transported by a truck or air plane, the vibrations the wafers being subjected to are different according to the construction of the vehicle, road condition, handling of the container, etc., and so there are various methods for preventing the adhesion of particles on the wafers. But there has been no effective means for preventing the generation of particles in the container.

SUMMARY OF THE INVENTION

The object of the present invention is, in the light of the problems mentioned above, to provide a wafer housing method and container and transfer process for housing the wafer into the container, which allow the adhesion of particles to the minimum even if the particles are generated during transport.

The process of reaching the present invention will be described hereinbelow.

The inventor of the present invention found that, the adhesion of particles on the mirror polished wafers which are vacuum-dried after cleaning their surfaces and housed in a hermetically sealed container, is largely reduced in the case where the inside space of the container is kept dry(for example, relative humidity is 10% or lower, or 2 ppm or lower, preferably 1 ppm or lower in absolute humidity) and the container is vibrated, comparing to the case where the inside space of the container is kept highly wet(for example, relative humidity is 40%, or 6.5~8 ppm in absolute humidity) and the container is vibrated.

The reason that particles are reluctant to adhere to the surface of wafer in the air of low water content can be explained as follows: in the case the surface of wafer is dry without water, even if a particle accelerated by the vibration collides against the wafer, the particle is simply repelled at the surface and not adheres to the wafer, but in the case the air in the container is highly wet, the surface of the wafer is damped and the particle adheres to the surface by the action of the water on the surface.

The present invention was made based on the fact mentioned above. The wafer housing method according to the present invention is a method wherein wafers mirror-polished, cleaned, dried of their surfaces are stored in the hermetically sealed space of a container filled with highly clean, dry gas of relative humidity lower than or equal to 10%. To be more concrete, it proposes a wafer housing method wherein wafers mirror-polished, cleaned, dried of their surfaces are retained in a hermetically sealed space filled with highly clean, dry gas of which the vapor phase contacting the wafers is kept to absolute humidity of less than or equal to 2 ppm, preferably less than or equal to 1 ppm.

Further, the wafer housing container according to the present invention is wherein; the container is a hermetically sealed vessel for housing wafers mirror-polished, cleaned, dried of their surfaces; the gas in the container is dry gas; and the absolute humidity of the gas is less than or equal to 2 ppm, preferably less than or equal to 1 ppm.

Still further, the first aspect of the transfer method according to the present invention is a transfer method for housing wafers mirror-polished, cleaned, dried of their surfaces into a container body of which the top opening can be closed with hermeticity by a cover, wherein the method comprises;

a process of substituting the air in the container body for dry air by supplying the dry air from the top opening, positioning the container body in an attitude in which the top opening is directed in directions other than an upward direction;

a process of housing the wafers into the container body, letting the top opening face the wafer supply position and maintaining the substituted state by the dry air; and a process of attaching the cover to the top opening after wafers are housed; and the processes are performed under a highly clean, dry gas.

The second aspect of the transfer method according to the present invention is a transfer method for housing wafers mirror-polished, cleaned, dried of their surfaces into a container body of which the front opening can be closed with hermeticity by a cover, wherein the method comprises;

a process of substituting the air in the container body for dry air by supplying the dry air from the front opening, positioning the container body in an attitude in which the front opening is directed in directions other than an upward direction;

a process of housing the wafers into the container body, letting the front opening face the wafer supply position and maintaining the substituted state by the dry air; and a process of attaching the cover to the top opening after wafers are housed; and the processes are performed under a highly clean, dry gas.

Here, the highly clean, dry gas means, for example, highly clean, dry air containing water as little as possible and almost no particles and other impurities, to be more specific, a gas containing particles of 0.2 μm or greater in grain size to less than or equal to 200 per cubic centimeter, preferably to less than or equal to 150 per cubic centimeter and its absolute humidity is lower than or equal to 2 ppm, preferably lower than or equal to 1 ppm of water.

The top opening of the container suitably disposed in an attitude in which the top opening is directed in directions other than an upward direction for effective exhausting the ordinary air (residual air containing water) in the container body to be substituted by the dry air, to be more specifically, in a downward or downward slanting direction. Further, the each step is preferably performed in a hermetically sealed space with absolute humidity of 2 ppm, preferably 1 ppm or lower.

DETAILED DESCRIPTION OF THE PREFERRED EMBODIMENTS

A preferred embodiment of the present invention will now be detailed with reference to the accompanying drawings. It is intended, however, that unless particularly specified, dimensions, materials, relative positions and so forth of the constituent parts described in the embodiments shall be interpreted as illustrative only not as limitative of the scope of the present invention.

Figure 3:
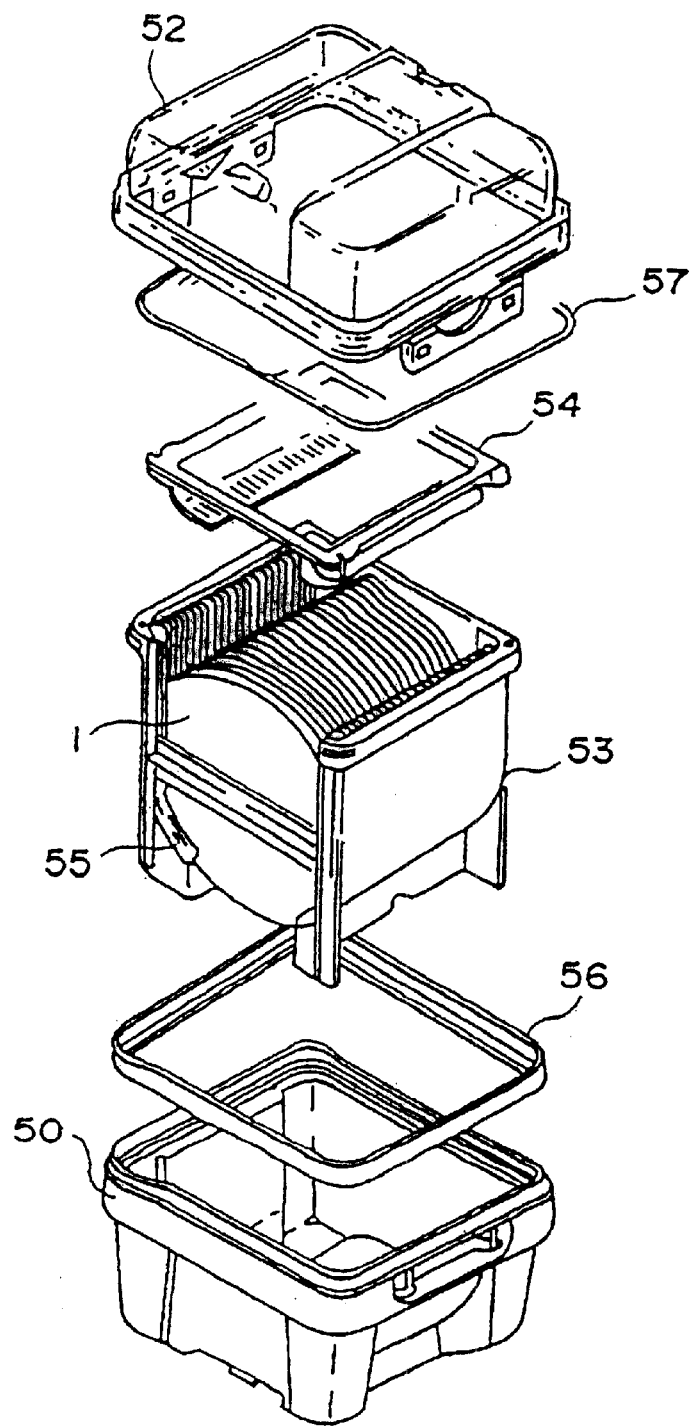
FIG. 3 is an isometric view showing a wafer container according to the present invention in disassembled state.

A wafer container is, as shown for example in FIG. 3, composed of a wafer basket 53 provided with support grooves 55 for housing a number of wafers 1 in parallel, a wafer container body 50 for housing the basket 53, a top cover 52 for covering the top opening of the wafer container body 50, a wafer stopper 54 for holding down the wafers 1 inside a wafer basket 53, and so forth. The wafer container is generally made of polypropylene, polycarbonate, or other organic resin.

The configuration like this is disclosed in Japanese Unexamined Utility Model Publication No. Hei-1 129836, and is generally known.

In the embodiment, sealing between the top cover 52 and the container body 50 is secured by two seal packing members 56, 57 to obtain high sealing performance.

Figure 4:
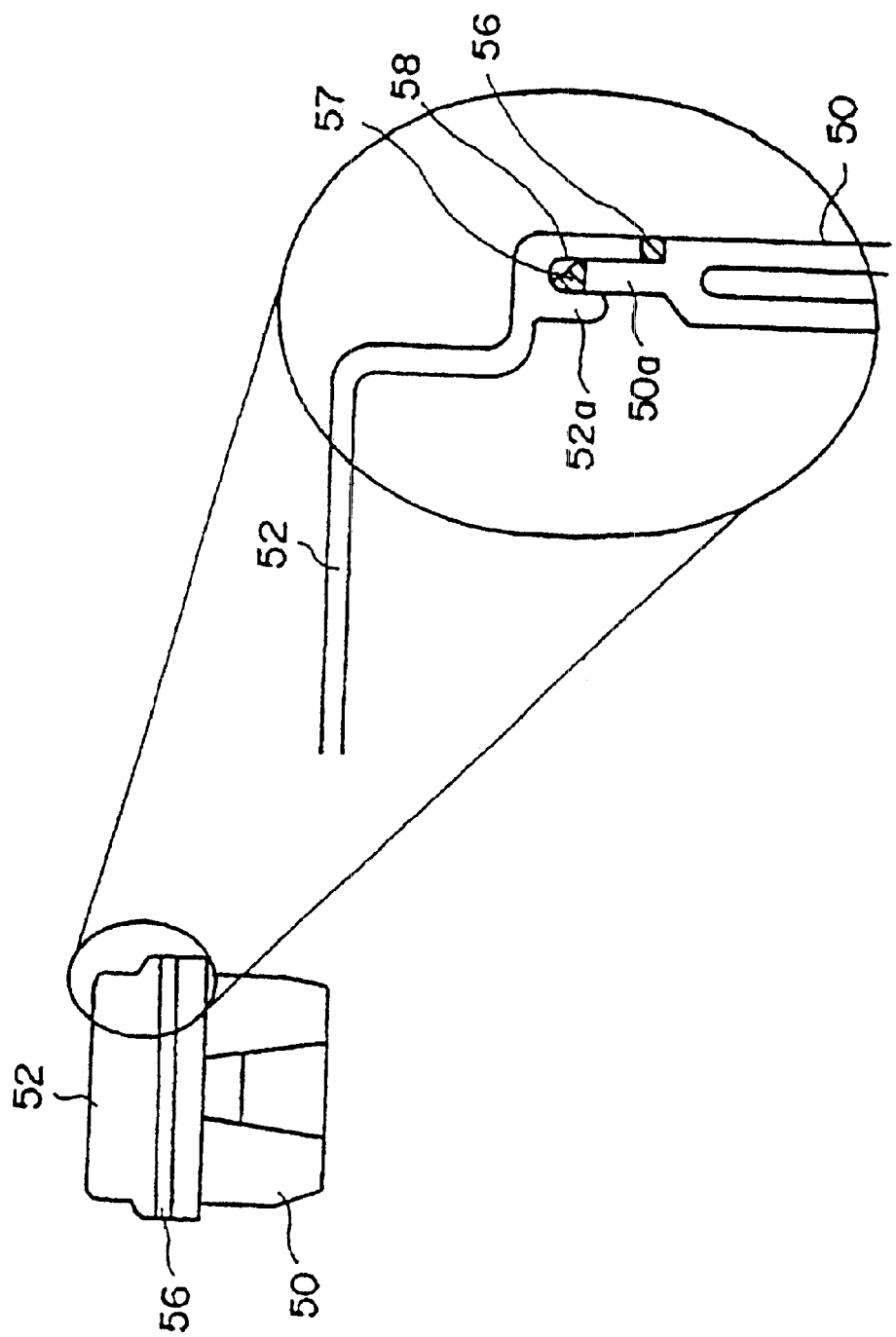
FIG. 4 is a partial magnified view of the wafer container of FIG. 3. In the preceding drawings, reference numerals 1 denotes wafer, 50 wafer container body, 52 cover, 56 and 57 seal packing.

Conventionally, the perimeter of the bottom end of the top cover 52 is formed in a shape of inverse U letter 52a, a convex 50a is formed on the top perimeter of the container body 50 so that the convex 50a fits in the inverse U letter 52a, and an inside perimeter seal type packing 57 is inserted in the fitting space 58. In the embodiment of the present invention, another packing 56 surrounding the outer periphery of the convex 50a is added, as shown in FIG. 4. The seal packing members 56, 57 are made of elastomer of polyolefin group or silicone rubber for obtaining further enhanced hermeticity.

An experiment was carried out using containers like this. A container capable of housing 25 pieces of wafers was used. Polypropylene, polyethylene of ultra high purity, or fluororesin, to which water is reluctant to adhere, was used as material for the container body 50 and the top cover 52. Further, to enhance hermeticity the construction having two rubber packing members as mentioned before was adopted.

Mirror-polished wafers were cleaned by RCA method, a generally used method of cleaning silicon wafer, in which wafers were cleaned by a mixture of ammonia, hydrogen peroxide, and water (SC-1), then immersed in diluted hydrofluoric acid, and after this cleaned by a mixture of hydrochloric acid, hydrogen peroxide, and water (SC-2). The wafers dried in vacuum at room temperature after the cleaning were housed into containers in three ways and hermetically sealed: (1) the wafers were housed into the container placed in the wafer transfer equipment with the inner space of the equipment kept to ordinary environment condition of, for example, temperature of 20° C. and relative humidity of 40% (absolute humidity of 6.5~8 ppm), or to put it another way, the wafers were housed into the container of which the inside air is of the said humidity and the container body 50 was covered by the top cover 52 to be hermetically sealed (comparative example 1); (2) the air of temperature of 20° C. and relative humidity of 10% (absolute humidity of 2 ppm) was introduced into the container, the wafers were housed, and hermetically sealed (example 1); and (3) the air of temperature of 20° C. and relative humidity of 5% (absolute humidity of 1 ppm) was introduced into the container, the wafers were housed, and hermetically sealed (example 2). Particle level of the wafers before transferred into the containers were same in the three cases.

The containers were subjected to nearly similar vibration sustained in a large truck travelling on paved road for 5 hours, in a clean room of temperature of 20° C. by a vibrator. After this, the container were opened, the number of particles generated on the wafer was evaluated.

The result was as follows: in the comparative example 1, the number of generated particles (particles increased on the wafer) of grain size of 0.10 μm or greater were 30 on an average and those of 0.2 μm or greater were 5 per 8 inch wafer; in the example 1, those of grain size of 0.10 μm or greater were 0.3 on an average; and in the example 2, those of grain size of 0.10 μm or greater were 0.10 on an average. Thus, it was recognized that the adhesion of particle to wafer was significantly suppressed.

An embodiment showing transfer and housing procedure according to the present invention will be detailed hereinbelow.

Figure 1:
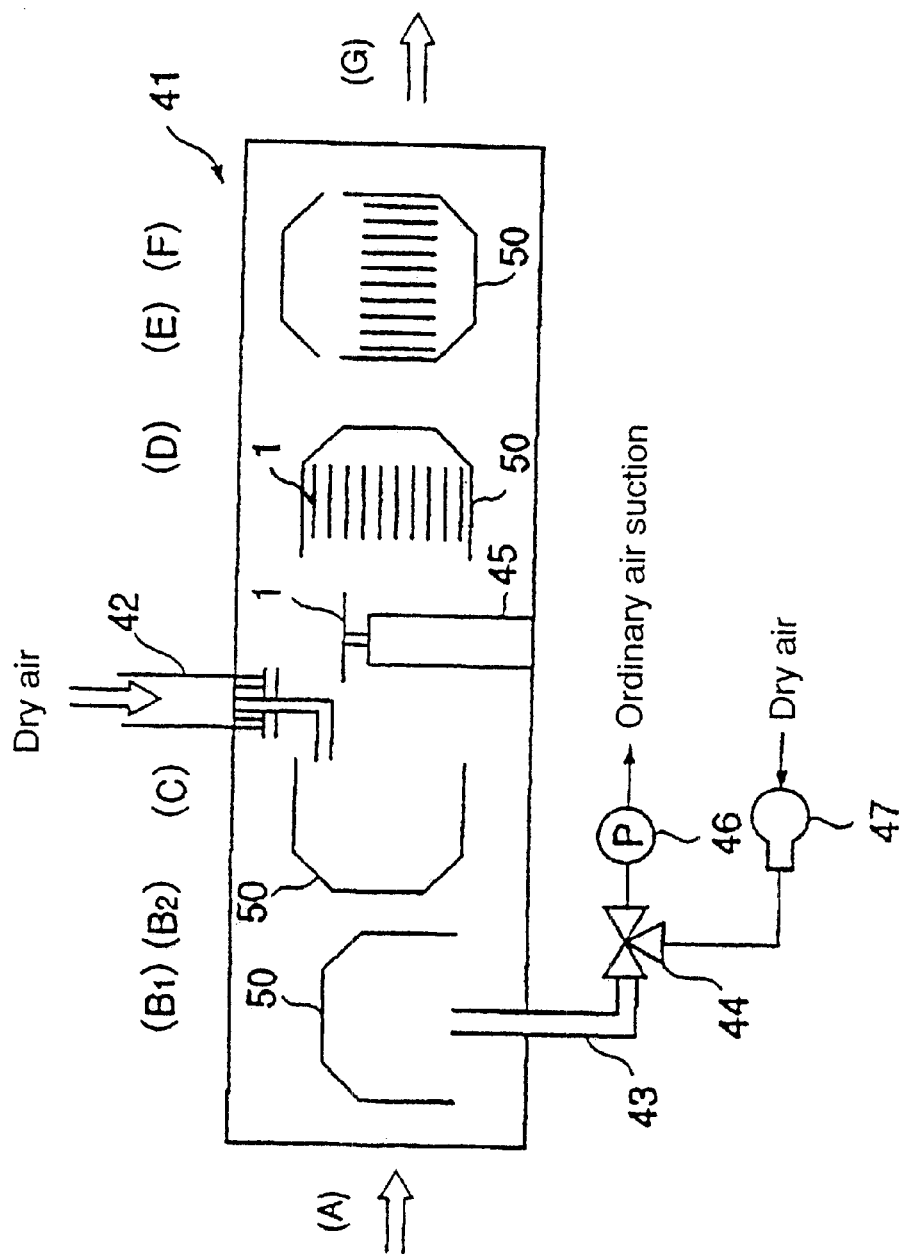
FIG. 1 is a diagrammatic sketch showing a wafer transfer equipment according to the present invention.
Figure 2:
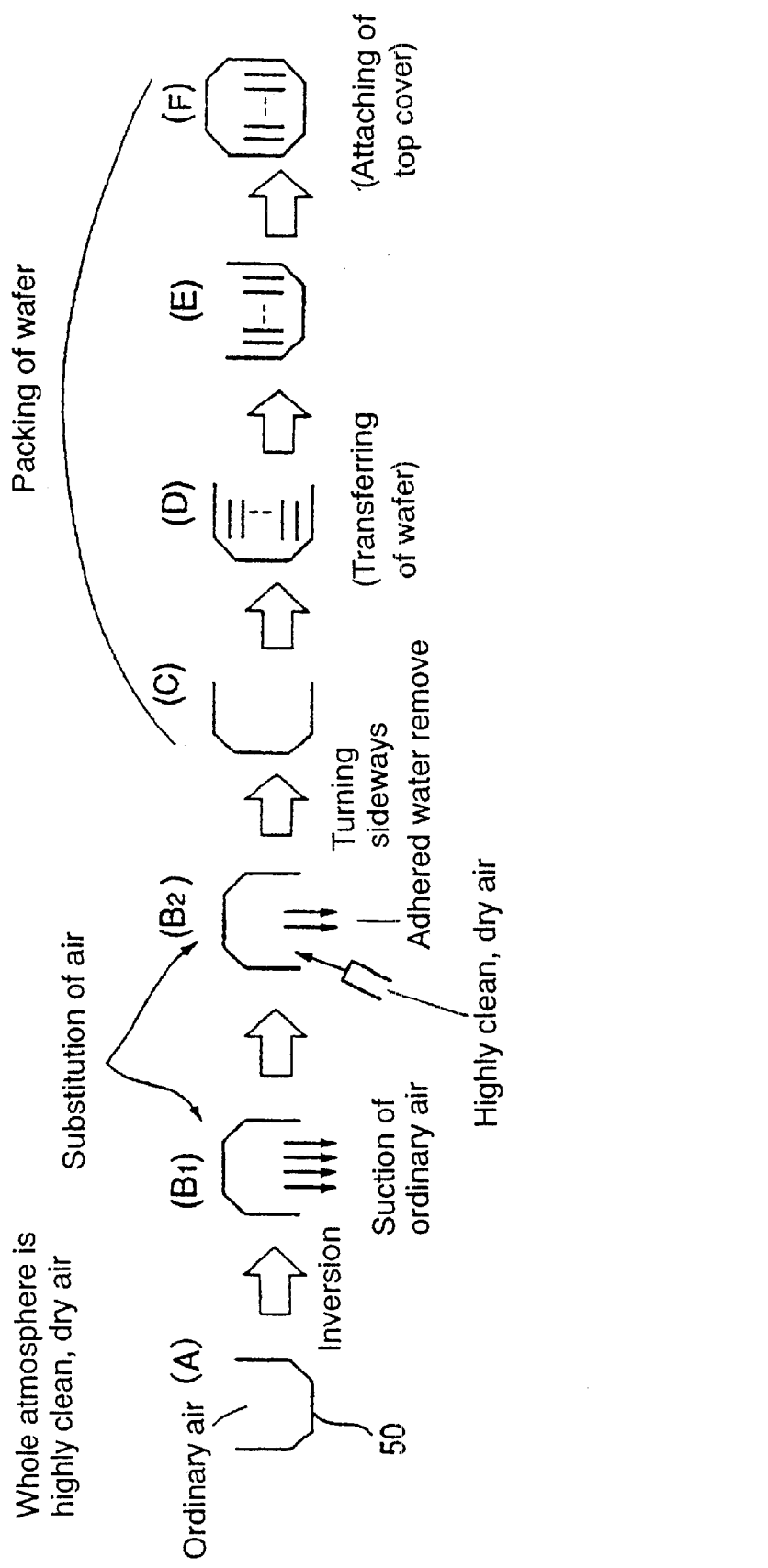
FIG. 2 is a flow diagram showing transfer and housing procedure according to the present invention.

FIG. 1 is a diagrammatic sketch showing a wafer transfer equipment, and FIG. 2 is a flow diagram showing transfer and housing procedure of wafers.

In FIG. 1, a transfer equipment 41 is composed so that; highly clean, dry air can be introduced into the space of the transfer equipment 41 from a dry air inlet 42; a container body 50, as shown in FIG. 3, introduced from an entrance (A), is turned upside down at positions ($B_1$), ($B_2$); the ordinary air in the container 50 is sucked out by a pump 46 through a pipe 43 provided upright from under at the said turning position, by way of a 3 way valve 44; and after this, the 3 way valve 44 is switched to introduce dry air into the container from a blower 47. Thus, the removal of adhered water and substitution for dry air are performed.

The suction (by suction means 43, 46) and introduction of dry air (by blowing means 43, 47) may be implemented via separate lines.

The highly clean, dry air is controlled by a producing unit for exclusive use so that its relative humidity is 10% or lower, or absolute humidity is 1 ppm or lower. The dry air is supplied through each pipe to predetermined positions in the transfer equipment. It is particularly preferable that, a supply pipe (dry air inlet 42) for supplying the dry air to the whole space of the transfer equipment 41, a pipe for supplying the dry air directly into the container 1, and a passage where the dry air is introduced to also when the wafers are transferred into the container body 50, are provided.

Next, at position (C), the container body 50 is again turned into a sideways position, then wafers 1 are transferred into the container body 50 by the use of a transfer means 45. The wafers are the ones which are mirror-polished, cleaned by the RCA cleaning method generally adopted, and dried by evacuation at room temperature. The wafers are packed in a cassette or wafer basket 53. They are transferred from the cassette or wafer basket 53 to the container body 50 by the use of the transfer means 45.

As to the method of transferring wafers into the container body 50, it may be suitable that the wafer basket 53 is set beforehand in the container body 50 and the wafers are transferred into the wafer basket 53 one by one from the casset, or that the cleaned and dried wafers are transferred to the wafer basket 53 in the transfer equipment 41 and then the wafers are transferred together with the wafer basket 53 to the container body 50.

The transfer process mentioned above will be again explained with reference to FIG. 2. Firstly, the air in the container supplied from the outside (A), is sucked out ($B_1$). The top opening of the container body 50 is directed downward and the sucking of the air is done from below by the use of the suction means 43, 46. This is because, the air in the container body 50 supplied from outside may be rich in water content and water rich air is heavier than the dry air in the transfer equipment 41. By directing the top opening of the container body 50 downward, the heavier, wet air in the container body is easy to be sucked out. At the same time with the sucking or with a time lag, dry air is blown into the container body 50 by the blowing means 43, 47 to completely dry the inside of the container body 50. Thus, the container body 50 is filled with dry air ($B_2$).

Next, after the container body 50 is turned into a sideways position (C), it is moved to the position for packing wafer and the wafers are packed (D).

Another experiment was carried out with the embodiment. 10 pieces of mirror-finished silicon wafer were put in a cassette, cleaned by RCA method, and vacuum-dried at room temperature. The cassette was set at the predetermined position in the transfer equipment 41 and the wafers in the cassette were transferred through the use of the transfer arm of the transfer means 45 to the wafer basket 53 set in the container body 50. The container body 50 with wafers stored was returned into upwards position (E). The top cover 52 was put on the container body 50, at the same time the joining part of the container body 50 and the top cover 52 was sealed by taping to enhance hermeticity, and then the container were covered with wrapping materials of laminated film and aluminum foil based film (F).

To verify the effect of the present invention, the wafers were repeatedly subjected to the vibration of a vibrator in a stored state as mentioned above. Then the wafers were taken out of the container body and the number of particles adhered to the wafers were counted.

The number of the particles was evaluated by a particle counter (LS-6030, mfd. by HITACHI Electronics Engineering Co.).

The result was that only one wafer out of 10 wafers suffered an increase in particles of grain size of 0.10 μm or greater. Thus, the increase of particles was not observed in almost all of the wafers. The number of particles right after cleaning (before housing in the container body) was 0~10, which particles were 0.10 μm or greater in grain size. The particle level was retained almost the same as this initial level.

Particles in the container were also evaluated by a liquid particle counter in a way as disclosed in Japanese Unexamined Patent Publication No. Hei-9-5227. The number of particles of grain size of 0.2 μm or greater in the container before packing the wafers was 150 per cubic centimeter and after subjection to vibration particles fairly increased to 500 per cubic centimeter.

As described above, in spite of increase in the number of particles in the container body, particles adhered to the wafer surface did not change, and it is recognized that the storage and transfer of wafers in the atmosphere mentioned above is preferable. It is also confirmed that, in the case of covering the container, for example, with compound film of aluminum foil or transparent film (laminate film), the atmosphere gas inside the wrapping materials is to be 2 ppm or lower, preferably 1 ppm or lower in its absolute humidity. The wrapping is suitable when storing the wafers for a long time, and particularly aluminum based wrapping materials prevent the intrusion of water and keep the good atmosphere.

It is preferable that the whole space inside a transfer equipment is kept dry with absolute humidity of about 0.1 ppm of water, but to reduce the whole space dry with absolute humidity of 0.1 ppm and maintain the dry state may be expensive in terms of equipment and maintenance. Therefore, it is acceptable that the whole space inside the transfer equipment is kept in a dry state of relative humidity of about 10% or lower, and the dry air supplied into the container body is kept dry with absolute humidity of, for example, 0.2 ppm or lower, preferably 0.1 ppm or lower.

As relative humidity changes in accordance with temperature, absolute humidity of 2 ppm or lower for the atmosphere in the transfer equipment is enough.

Foregoing description concerns a wafer container of which an opening is provided on the top. Recently, a container called FOSB (Front Opening Shipping Box) which has an opening in the front, is being used for wafers of diameter of 300 mm or larger.

Figure 5:
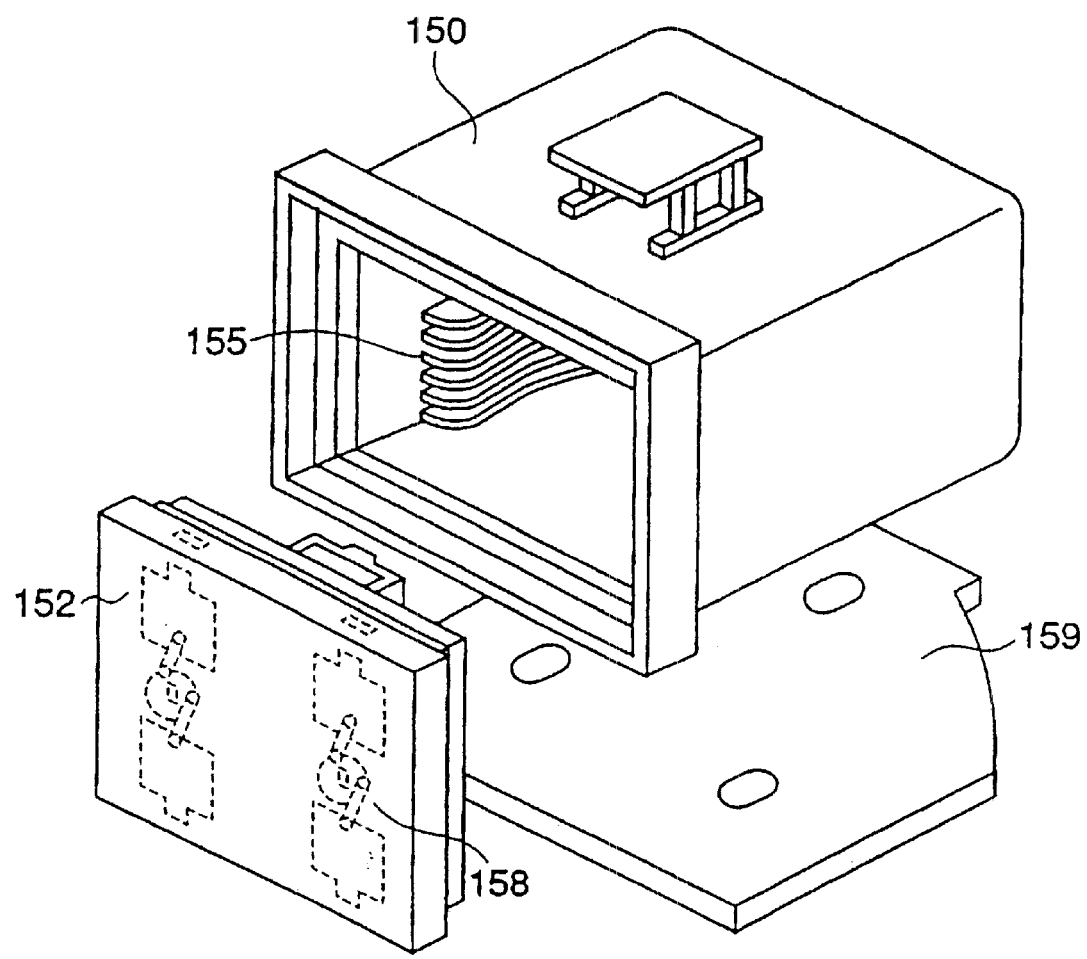
FIG. 5 is an isometric view showing a conventional precision substrate container in disassembled state.

The FOSB comprises, as shown in FIG. 5, a wafer container body 150 having wafer support grooves 155 stacked inside it; and a front cover 152 having a wafer retainer on its rear face and a seal packing on around its periphery for closing the front opening of the wafer container body 150. Also the FOSB like this is generally made of polypropylene, polycarbonate or other organic resin.

To be more concrete, the FOSB has a container 150 for housing a plurality of semiconductor wafers (hereunder referred to as wafers); a detachable/attachable front cover 152 which covers the front opening of the container body 150; and a bottom plate 159 attached to the underside of the container 150. The container 150 is shaped into a box with an opening on the front, and a plurality of clamp holes (not shown in the drawings) are prepared on the inside upper and lower periphery of the front opening. Inside the container 150, a rear retainer (not shown in the drawings) is provided on the back face, and wafer support grooves 155 are provided, facing each other, on both the left and right faces. The rear retainer and pairs of wafer support grooves 155 allow the plurality of wafers arrayed in a vertical direction.

The front cover 152 has built-in open/close lock mechanisms 158 which allows up-and-down movements of a plurality of latch plates through the rotation of disks. Each latch plate of the open/close lock mechanism has a clamping claw formed at a periphery of it, which claw is allowed to rise up or set down through each through-hole of the front cover 152. The front cover 152 is fitted and tightly locked to the front of the container 150 through the mating of each clamping claw with each clamp hole.

The process of wafer transfer according to the present invention is applicable to a FOSB like this. The process can be performed in almost the same way as performed in the wafer transfer process shown in FIG. 2 by the use of the wafer transfer equipment shown in FIG. 1.

Different points in the case of FOSB are as follows: in position (A) in FIG. 2, the top opening of the container body is not in an upward position but in a sideways position like the attitude shown in (C) in the figure; accordingly, the operation between (A) and ($B_1$) is not to turn the container body upside down but to turn the front opening from horizontal to downward direction; and in position (D), the front cover is able to be fit without turning the container body after wafers are transferred into the container body. These differences are slight and insignificant, and so the application of the process of wafer transfer according to the present invention to a container of which the opening is prepared on the front as is the case with FOSB, is possible.

Particle adhesion problem occurs generally during transport of mirror-polished, cleaned, and dried wafers, but it is also a problem to wafers after treatment such as epitaxial growth or device processing.

Increase of particles on these wafers can be suppressed by storing them in an atmosphere condition according to the present invention. So, here, wafers mirror-polished, cleaned, dried refer to wafers which are in a state in that the adhesion of particles must be suppressed to a minimum.

Effects of the Invention

As described above, according to the present invention, in the case where wafers after mirror-polishing are transported to a device manufacturing process, particle adhesion to the wafers during transport can be prevented, and particle inspection and cleaning of wafers transported to the wafer manufacturing process can be made unnecessary.

What is claimed is:

1. A method of transferring a mirror-polished wafer having a cleaned and dried surface, comprising:

providing a container body having an opening which can be closed hermetically with a cover;

positioning the container body such that said opening is directed other than in an upward direction and filling said container with dry air through said opening;

orienting the container body such that said opening faces a wafer supply position and introducing a mirror-polished wafer having a cleaned and dried surface into said container body while maintaining the dry air in said container body; and attaching the cover to said opening to hermetically seal the container;

wherein the foregoing are performed under a highly clean, dry gas.

2. A method according to claim 1, wherein said opening is a top opening.

3. A method according to claim 2, wherein said method is performed in a closed space filled with highly clean, dry gas having an absolute water content of less than or equal to 2 ppm.

4. A method according to claim 3, wherein said highly clean, dry gas has an absolute water content of less than or equal to 1 ppm.

5. A method according to claim 2, wherein the highly clean, dry gas contains less than or equal to 200 preferably 150 per cubic centimeter particles having a grain size of 0.2 $\mu$m or greater per cubic centimeter, and the absolute water content of the gas is maintained less than or equal to 2 ppm.

6. A method according to claim 5, wherein the clean, dry gas contains less than or equal to 150 particles having a grain size of 0.2 $\mu$m or greater per cubic centimeter, and the absolute water content of the gas is maintained less than or equal to 1 ppm.

7. A method according to claim 1, wherein said opening is a top opening.

8. A method according to claim 7, wherein said method is performed in a closed space filled with highly clean, dry gas having an absolute water content of less than or equal to 2 ppm.

9. A method according to claim 8, wherein said highly clean, dry gas has an absolute water content of less than or equal to 1 ppm.

10. A method according to claim 7, wherein the highly clean, dry gas contains less than or equal to 200 preferably 150 per cubic centimeter particles having a grain size of 0.2 $\mu$m or greater per cubic centimeter, and the absolute water content of the gas is maintained less than or equal to 2 ppm.

11. A method according to claim 10, wherein the clean, dry gas contains less than or equal to 150 particles having a grain size of 0.2 $\mu$m or greater per cubic centimeter, and the absolute water content of the gas is maintained less than or equal to 1 ppm.

* * * * *